US012628636B2

(12) United States Patent
Medikonda et al.

(10) Patent No.: US 12,628,636 B2
(45) Date of Patent: May 12, 2026

(54) SEMICONDUCTOR STRUCTURE WITH TOP VIA HAVING EXTENDED BOTTOM CONTACT

(71) Applicant: International Business Machines Corporation, Armonk, NY (US)

(72) Inventors: Manasa Medikonda, Albany, NY (US); Tao Li, Slingerlands, NY (US); Ruilong Xie, Niskayuna, NY (US); Chih-Chao Yang, Glenmont, NY (US)

(73) Assignee: International Business Machines Corporation, Armonk, NY (US)

( * ) Notice: Subject to any disclaimer, the term of this patent is extended or adjusted under 35 U.S.C. 154(b) by 425 days.

(21) Appl. No.: 18/312,145

(22) Filed: May 4, 2023

(65) Prior Publication Data

US 2024/0371750 A1      Nov. 7, 2024

(51) Int. Cl.
| | |
|---|---|
| *H10W 20/42* | (2026.01) |
| *H10W 20/00* | (2026.01) |
| *H10W 20/41* | (2026.01) |

(52) U.S. Cl.
CPC ......... *H10W 20/42* (2026.01); *H10W 20/057* (2026.01); *H10W 20/064* (2026.01); *H10W 20/082* (2026.01); *H10W 20/435* (2026.01)

(58) Field of Classification Search
CPC ........... H01L 23/5226; H01L 21/76804; H01L 21/76879; H01L 21/76886; H01L 23/5283
See application file for complete search history.

(56) References Cited

U.S. PATENT DOCUMENTS

| | | | |
|---|---|---|---|
| 9,613,861 | B2 | 4/2017 | Anderson |
| 9,793,163 | B2 | 10/2017 | Bristol |
| 10,049,920 | B1 | 8/2018 | Anderson |
| 10,734,277 | B2 | 8/2020 | Yang |
| 11,177,163 | B2 | 11/2021 | Motoyama |
| 11,232,977 | B2 | 1/2022 | Anderson |
| 2015/0056800 | A1 | 2/2015 | Mebarki |
| 2021/0399099 | A1 | 12/2021 | Chu |
| 2022/0344262 | A1* | 10/2022 | Sharma ................. H01L 23/522 |
| 2023/0069107 | A1* | 3/2023 | Wei ...................... H10D 89/921 |

* cited by examiner

*Primary Examiner* — Jay C Kim
*Assistant Examiner* — Woo K Lee
(74) *Attorney, Agent, or Firm* — Kimberly Zillig

(57) ABSTRACT

A semiconductor structure that includes a metal level, a via located directly on top of a first portion of the metal level, wherein the via is tapered such that a smaller critical dimension is located at a top portion of the via and a larger critical dimension is located at a bottom portion of the via, and the bottom portion of the via is located adjacent the metal level, a dielectric cap located on top of a second portion of the metal level on which the via is not located directly thereon, and a next metal level that is located directly on the top portion of the via.

14 Claims, 10 Drawing Sheets

X-X                                        Y-Y

<u>200</u>

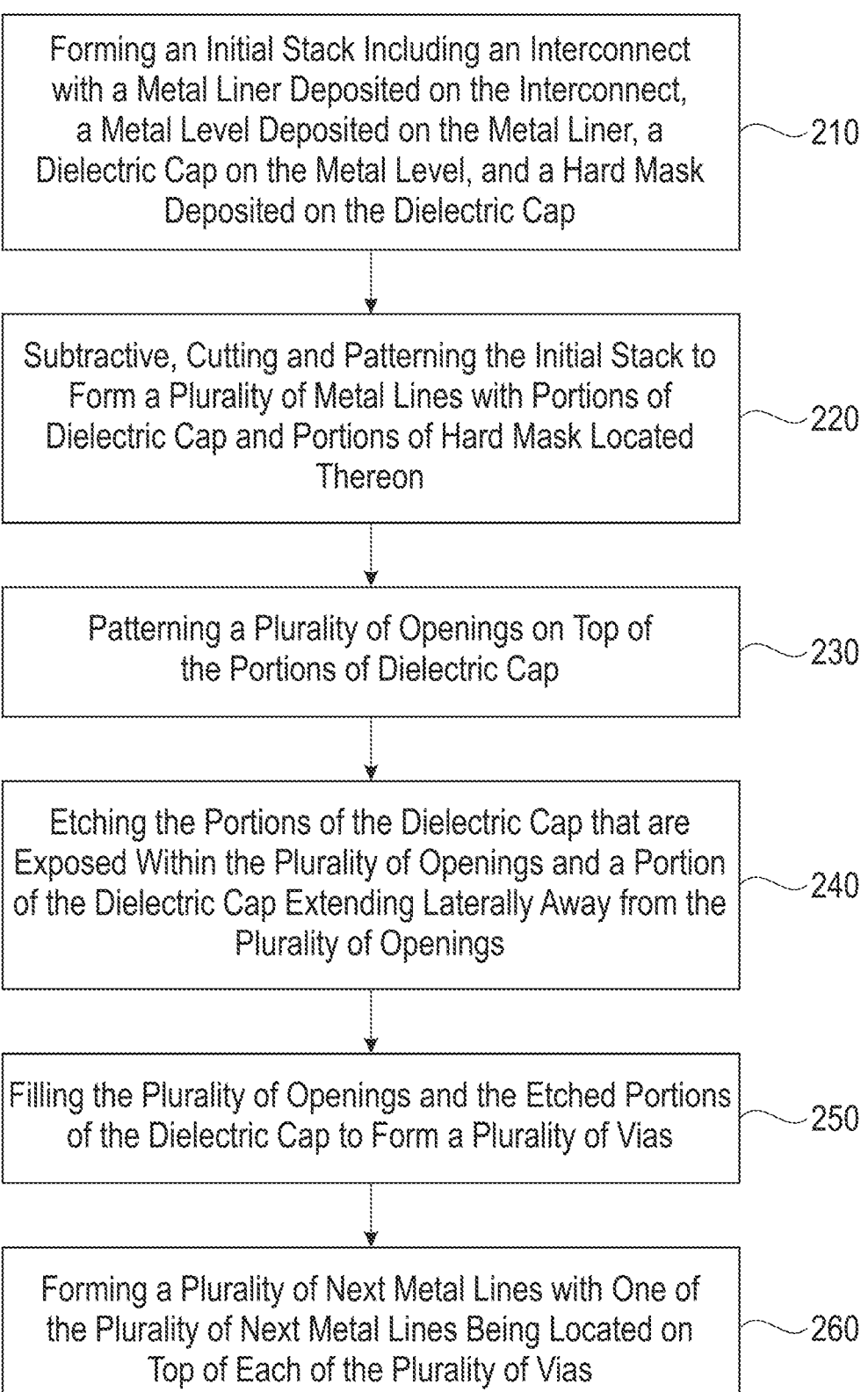

Forming an Initial Stack Including an Interconnect with a Metal Liner Deposited on the Interconnect, a Metal Level Deposited on the Metal Liner, a Dielectric Cap on the Metal Level, and a Hard Mask Deposited on the Dielectric Cap ～210

Subtractive, Cutting and Patterning the Initial Stack to Form a Plurality of Metal Lines with Portions of Dielectric Cap and Portions of Hard Mask Located Thereon ～220

Patterning a Plurality of Openings on Top of the Portions of Dielectric Cap ～230

Etching the Portions of the Dielectric Cap that are Exposed Within the Plurality of Openings and a Portion of the Dielectric Cap Extending Laterally Away from the Plurality of Openings ～240

Filling the Plurality of Openings and the Etched Portions of the Dielectric Cap to Form a Plurality of Vias ～250

Forming a Plurality of Next Metal Lines with One of the Plurality of Next Metal Lines Being Located on Top of Each of the Plurality of Vias ～260

FIG. 10

SEMICONDUCTOR STRUCTURE WITH TOP VIA HAVING EXTENDED BOTTOM CONTACT

BACKGROUND

The present disclosure relates to fabrication methods and resulting structures for semiconductor devices. More particularly, the present disclosure provides a semiconductor structure with a top via having an extended bottom contact aligned to a metal line.

Generally, semiconductor devices include a plurality of circuits which form an integrated circuit (IC) fabricated on a semiconductor substrate. A complex network of signal paths will normally be routed to connect the circuit elements distributed on the surface of the substrate. Efficient routing of these signals across the device requires formation of multilevel or multilayered schemes, such as, for example, single or dual damascene wiring structures. For the IC device to be functional, multi-level or multi-layered interconnection schemes such as, for example, dual damascene wiring (interconnect structures) or wiring formed by subtractive etch, are fabricated using back end of line (BEOL) techniques to connect the circuit elements distributed on the surface of the device. Within a typical interconnect structure, metal vias run perpendicular to the semiconductor substrate and metal lines run parallel to the semiconductor substrate.

SUMMARY

According to some embodiments of the disclosure, there is provided a semiconductor structure. The semiconductor structure includes a metal level, a via located directly on top of a first portion of the metal level, wherein the via is tapered such that a smaller critical dimension is located at a top portion of the via and a larger critical dimension is located at a bottom portion of the via, and the bottom portion of the via is located adjacent the metal level, a dielectric cap located on top of a second portion of the metal level on which the via is not located directly thereon, and a next metal level that is located directly on the top portion of the via.

According to some embodiments of the disclosure, there is provided a semiconductor structure. The semiconductor structure includes a first metal line, a via including an extended bottom portion that is located atop a first portion of the first metal line and is aligned along a direction of the first metal line, and a second metal line located atop the via.

According to some embodiments of the disclosure, there is provided a method of forming a semiconductor structure. The method includes an operation of forming an initial stack including an interconnect with a metal liner deposited on the interconnect, a metal level deposited on the metal liner, a dielectric cap deposited on the metal level, and a hard mask deposited on the dielectric cap. Another operation is subtractively cutting and patterning the initial stack to form a plurality of metal lines with portions of the dielectric cap and portions of the hard mask located thereon. A further operation is patterning a plurality of openings on top of the portions of the dielectric cap. Yet another operation is etching portions of the dielectric cap that are exposed within the plurality of openings and a portion of the dielectric cap extending laterally away from the plurality of openings. Another operation is filling the plurality of openings and etched portions of the dielectric cap to form a plurality of vias. A further operation is forming a plurality of next metal lines with one of the plurality of next metal lines being located on top of each of the plurality of vias.

The above summary is not intended to describe each illustrated embodiment or every implementation of the present disclosure.

BRIEF DESCRIPTION OF THE DRAWINGS

The drawings included in the present application are incorporated into, and form part of, the specification. They illustrate embodiments of the present disclosure and, along with the description, serve to explain the principles of the disclosure. The drawings are only illustrative of certain embodiments and do not limit the disclosure.

FIG. 10 is a flow diagram of a process for forming a semiconductor structure disclosed herein, in accordance with embodiments of the disclosure.

Figure 1:
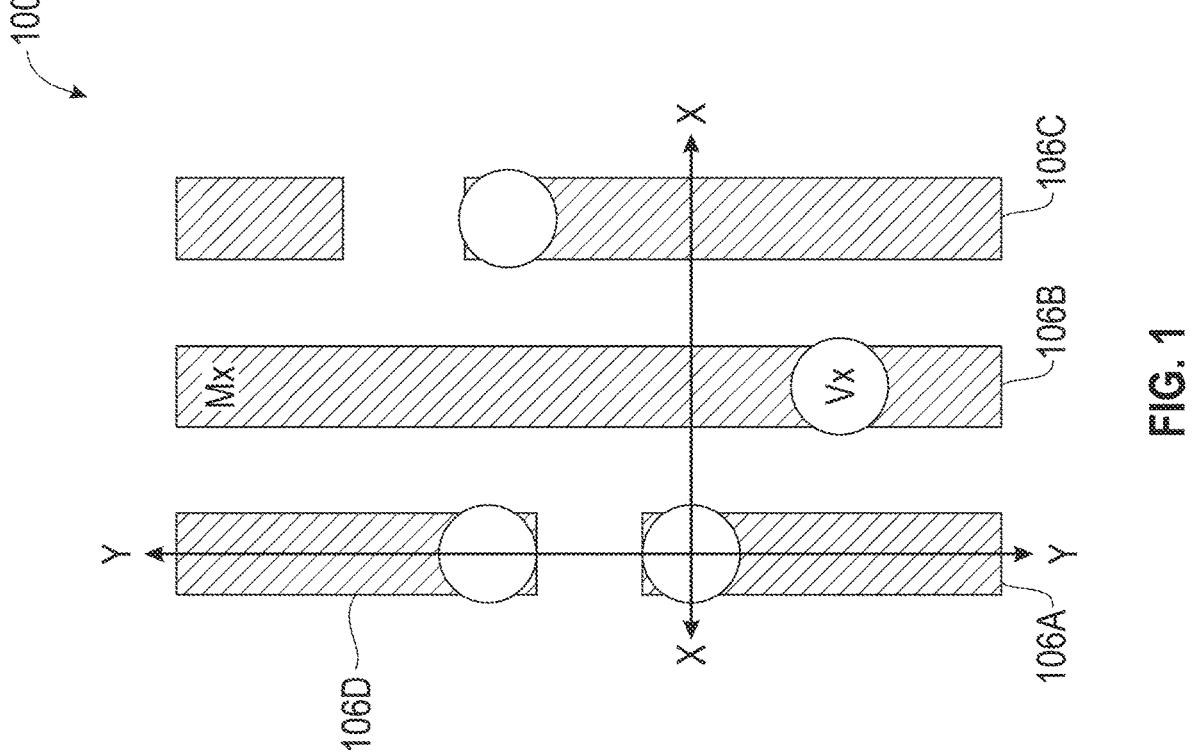
FIG. 1 illustrates a top view of a semiconductor structure disclosed herein and includes locations of where two cross-sections are taken (at X-X and at Y-Y) that are shown in cross-sectional views in the following FIGS. 2-9, in accordance with embodiments of the disclosure.

While the disclosure is amenable to various modifications and alternative forms, specifics thereof have been shown by way of example in the drawings and will be described in detail. It should be understood, however, that the intention is not to limit the disclosure to the particular embodiments described. On the contrary, the intention is to cover all modifications, equivalents, and alternatives falling within the spirit and scope of the disclosure.

DETAILED DESCRIPTION

Aspects of the present disclosure relate generally to fabrication methods and resulting structures for semiconductor devices. More particularly, the present disclosure provides a semiconductor structure with a top via having an extended bottom contact aligned to a metal line. While the present disclosure is not necessarily limited to such applications, various aspects of the disclosure can be appreciated through a discussion of various examples using this context.

Interconnect structures in back end-of-line (BEOL) technologies can be formed by damascene processes and etching. Subtractive metal etching has become an industrial trend to form interconnect structures. In some cases, an opening in the interconnect level may be a via, extending perpendicular to the surface of the integrated circuit (IC) completely through the interlayer dielectric (ILD) for connecting an overlying wire of a higher wiring level or of the present wiring level to an underlying wire of a lower wiring level. A filled via is typically simply referred to as a via.

Exemplary embodiments of the disclosure will now be discussed in further detail with regard to semiconductor devices and methods of manufacturing the same and, in particular, to via formation defined by a subtractive metal etch process during fabrication of a semiconductor device. After subtractive metal etch techniques, a top via can have critical dimension (CD) variability and structural instability. One feature and advantage of the disclosed structures and processes is a top via formation method that provides an extended bottom portion along a metal line direction while being self-aligned at a cross metal lines direction in order to improve via stability. The disclosed processes also can reduce via to metal lines resistance and can prevent via-via and/or via-metal line shorting.

It is to be understood that the various layers and/or regions shown in the accompanying drawings are not drawn to scale, and that one or more layers and/or regions of a type commonly used in complementary metal-oxide semiconductor (CMOS), fin field-effect transistor (FinFET), metal-oxide-semiconductor field-effect transistor (MOSFET), and/or other semiconductor devices, may not be explicitly shown in a given drawing. This does not imply that the layers and/or regions not explicitly shown are omitted from the actual devices. In addition, certain elements may be left out of particular views for the sake of clarity and/or simplicity when explanations are not necessarily focused on the omitted elements. Moreover, the same or similar reference numbers used throughout the drawings are used to denote the same or similar features, elements, or structures, and thus, a detailed explanation of the same or similar features, elements, or structures will not be repeated for each of the drawings.

The semiconductor devices and methods for forming same in accordance with embodiments of the present disclosure can be employed in applications, hardware, and/or electronic systems. Suitable hardware and systems for implementing embodiments of the invention may include, but are not limited to, personal computers, communication networks, electronic commerce systems, portable communications devices (e.g., cell and smart phones), solid-state media storage devices, functional circuitry, etc. Systems and hardware incorporating the semiconductor devices are contemplated embodiments of the invention. Given the teachings of embodiments of the invention provided herein, one of ordinary skill in the art will be able to contemplate other implementations and applications of embodiments of the invention.

The embodiments of the present disclosure can be used in connection with semiconductor devices that may require, for example, CMOSs, MOSFETs, and/or FinFETs. By way of non-limiting example, the semiconductor devices can include, but are not limited to CMOS, MOSFET, and FinFET devices, and/or semiconductor devices that use CMOS, MOSFET, and/or FinFET technology.

It is to be understood that the present disclosure will be described in terms of a given illustrative architecture; however, other architectures, structures, substrate materials and process features and steps/blocks can be varied within the scope of the present disclosure. It should be noted that certain features cannot be shown in all figures for the sake of clarity. This is not intended to be interpreted as a limitation of any particular embodiment, or illustration, or scope of the claims.

FIG. 1 illustrates a top view of a semiconductor structure 100 (in final form of FIG. 9) disclosed herein that contains a simplistic plan view of the structure 100. The figure depicts locations where cross-sectional views, as depicted in FIGS. 2-9 (at X-X and at Y-Y), were taken. More specifically, the view "X-X" is a cross-sectional view that is taken across the semiconductor structure 100, and the view "Y-Y" is a cross-sectional view that is taken along the semiconductor structure 100. The components of the semiconductor structure 100 are discussed below with regard to FIGS. 2-9.

Figure 7:
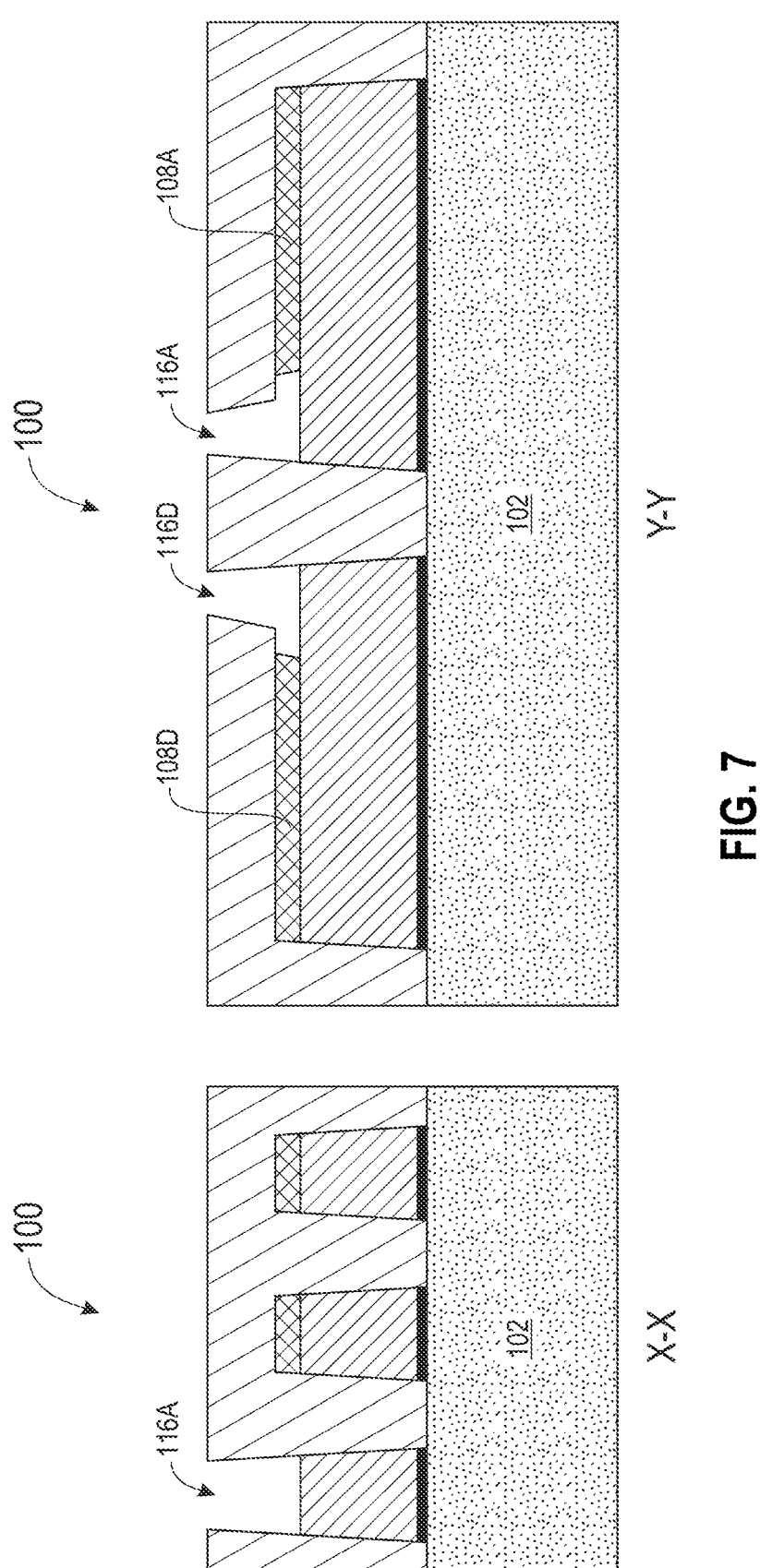
FIG. 7 illustrates two cross-sectional views during formation of the semiconductor structure of FIG. 9, taken at X-X and Y-Y (as shown in FIG. 1) after a fabrication operation, in accordance with embodiments of the disclosure.
Figure 8:
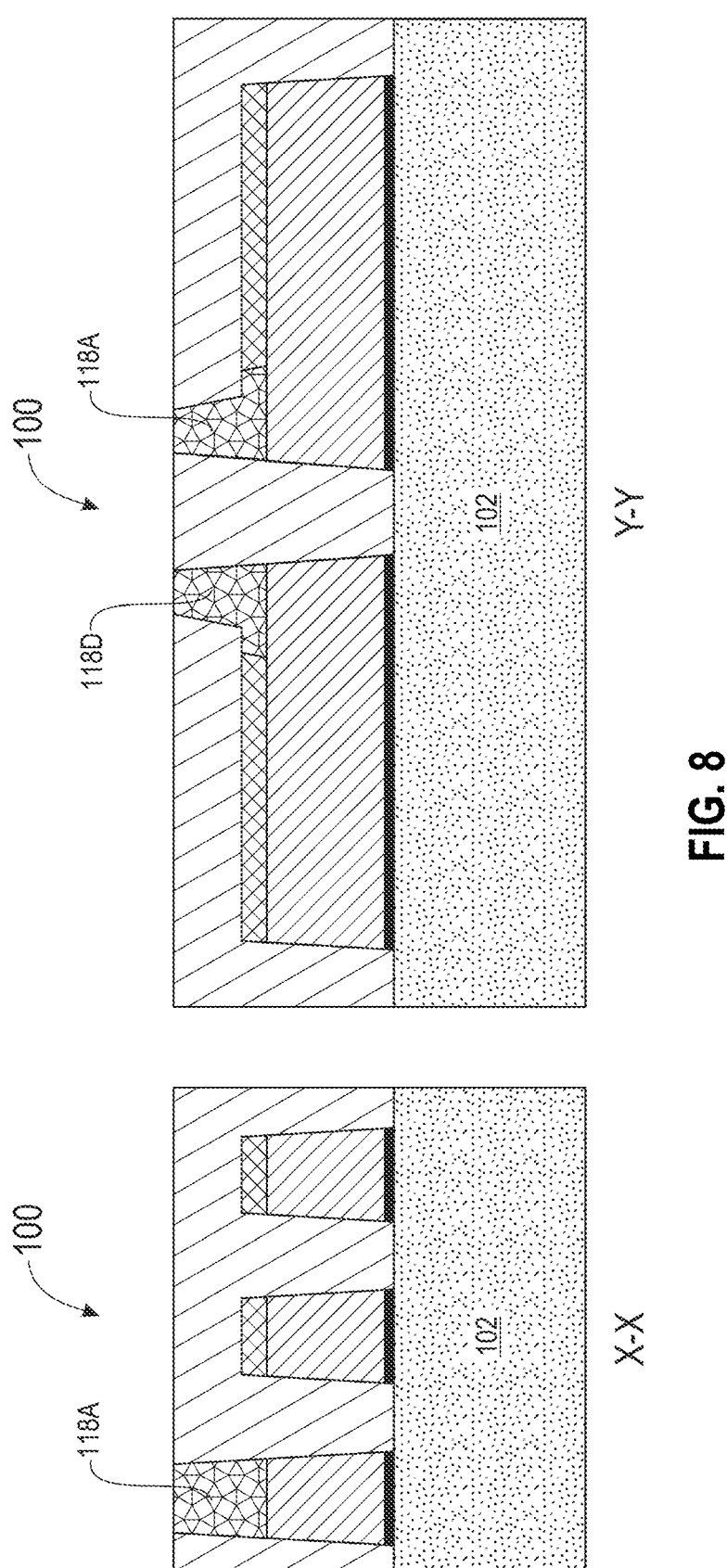
FIG. 8 illustrates two cross-sectional views during formation of the semiconductor structure of FIG. 9, taken at X-X and Y-Y (as shown in FIG. 1) after a fabrication operation, in accordance with embodiments of the disclosure.
Figure 9:
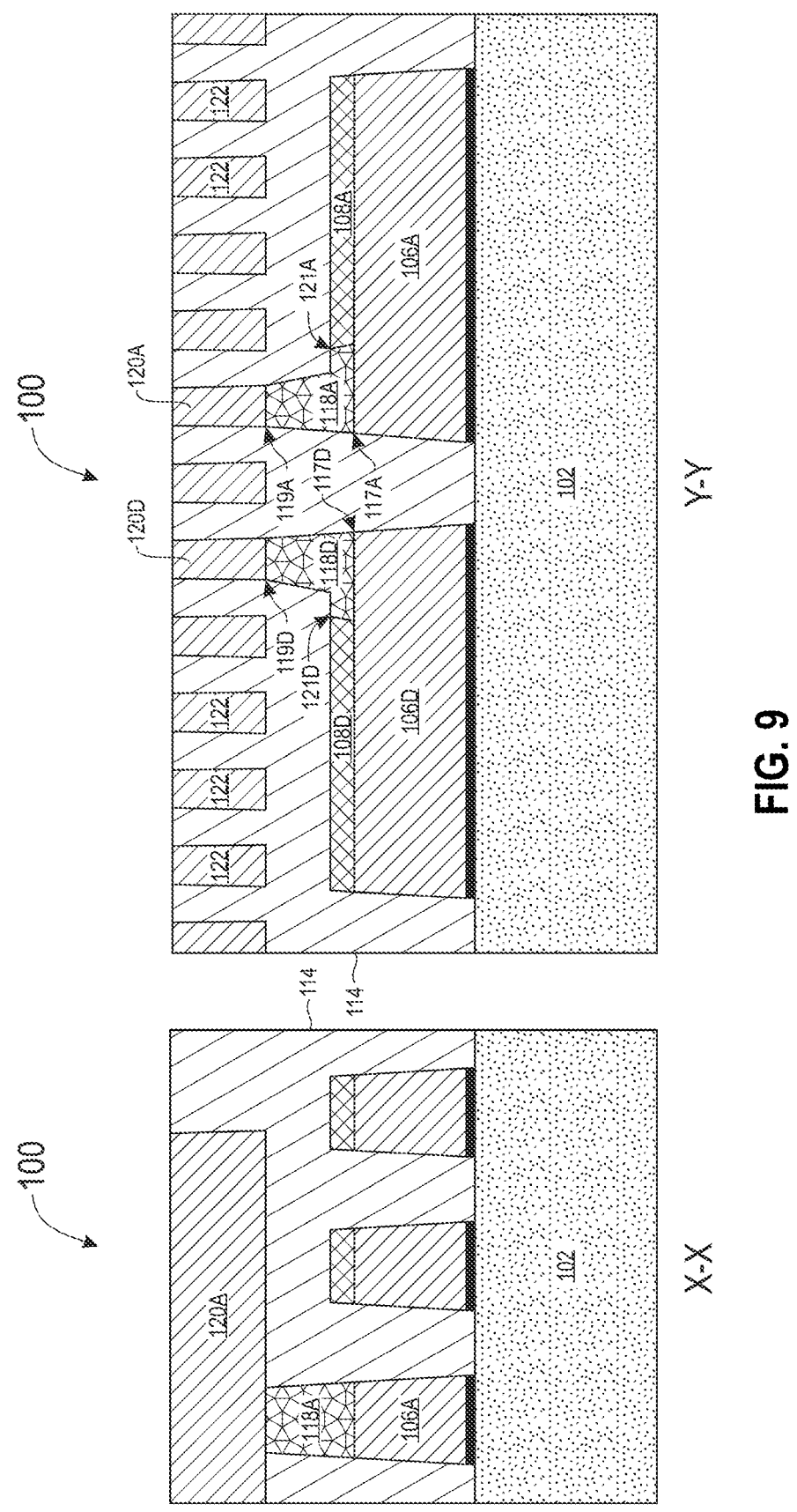
FIG. 9 illustrates two cross-sectional views of the semiconductor structure, taken at X-X and Y-Y (as shown in FIG. 1) after a fabrication operation, in accordance with embodiments of the disclosure.

FIGS. 2-9 each illustrate two cross-sectional views of the semiconductor structure 100 of FIG. 1, taken at X-X and Y-Y (as shown in FIG. 1), with the two views, X-X and Y-Y, shown side-by-side and taken at various operations in a process to form the semiconductor structure 100 of FIG. 9, in accordance with embodiments of the disclosure.

Figure 2:
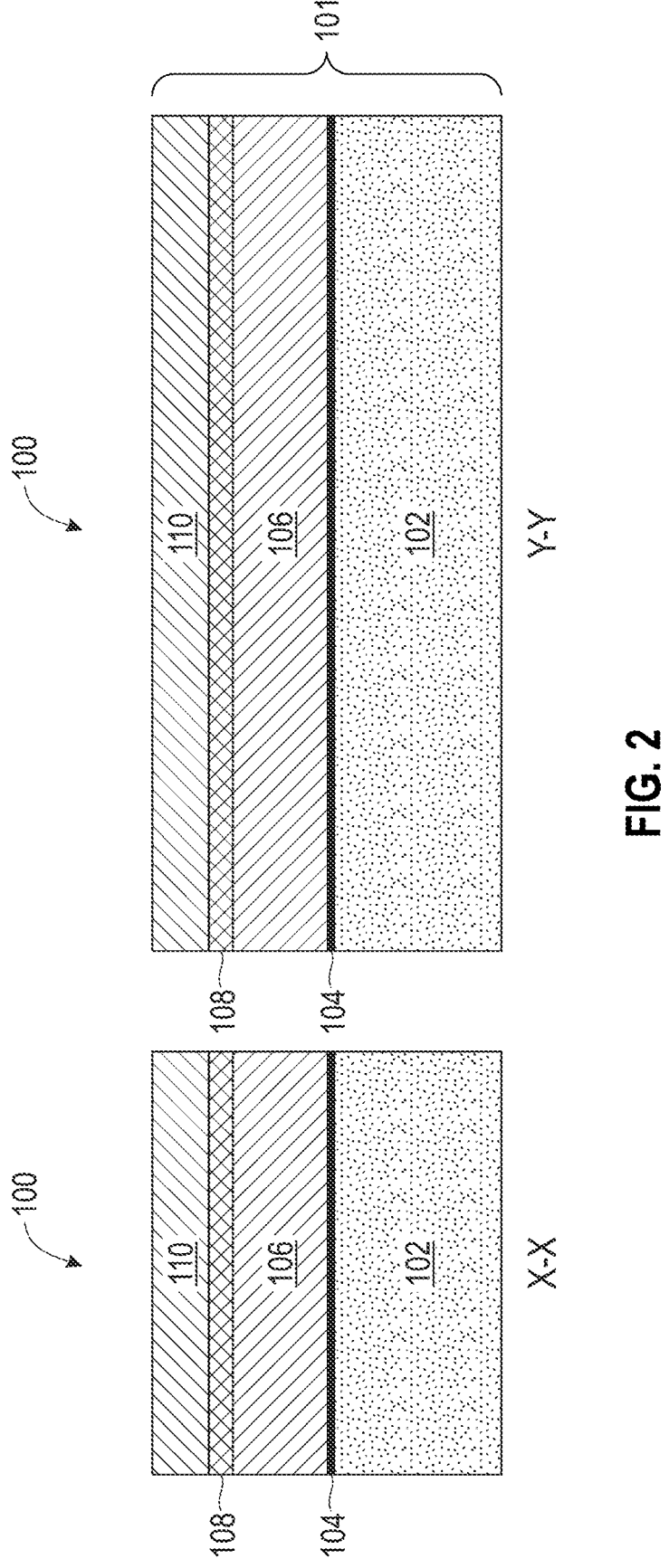
FIG. 2 illustrates two cross-sectional views during formation of the semiconductor structure of FIG. 9, taken at X-X and Y-Y (as shown in FIG. 1) after a fabrication operation, in accordance with embodiments of the disclosure.

FIG. 2 illustrates two cross-sectional views during formation of the semiconductor structure 100 of FIG. 9, taken at X-X and Y-Y (as shown in FIG. 1) after a fabrication operation, in accordance with embodiments of the disclosure. An underneath device or an interconnect 102 is located at the bottom of the semiconductor structure 100 of FIG. 2. A barrier/metal liner 104, which can be an adhesion metal liner layer, that can be made of materials, such as tantalum (Ta), titanium (Ti), titanium nitride (TiN), ruthenium (Ru), ruthenium nitride (RuN), ruthenium tantalum (RuTa), ruthenium tantalum nitride (RuTaN), tungsten (W), tungsten nitride (WN), or tantalum nitride (TaN), for example, is shown layered atop the device or interconnect 102. Other materials are contemplated for the barrier/metal liner layer 104. Processes for deposition of the barrier/metal liner layer 104 can be atomic layer deposition (ALD), chemical vapor deposition (CVD), physical vapor deposition (PVD), and electrochemical deposition, for example.

A metal level (Mx) (i.e., a metal line) 106 is shown layered atop the barrier/metal liner layer 104 The metal level 106 can be a conductive metal or alloy, such as Ru, W, aluminum (Al), cobalt (Co), copper (Cu), aluminum copper (AlCu), copper manganese (CuMn), and copper titanium (CuTi), etc. for example. The metal level 106 can comprise, but is not limited to, ruthenium, tungsten, aluminum, cobalt, copper, manganese, titanium, or alloys thereof. The metal level 106 can be applied using suitable techniques, such as CVD, PVD, plasma-enhanced chemical vapor deposition (PECVD), sputtering, plating, electroless plating or chemical solution deposition, for example.

A thin dielectric film 108 known as a "dielectric cap" is shown applied atop the metal level 106. The dielectric cap 108 can be an ultra-low k dielectric material. The ultra-low k dielectric material can include one or more layers of an insulating material. Insulating materials typically include pure or doped silicate glasses with doping being fluorine or carbon; carbon-doped silicon oxide (SiCOH), silsequi-oxanes, siloxanes, or other dielectric materials. The insulating materials can include nitrogen. The dielectric cap 108 can include any interlevel or intralevel dielectric material (ILD) including inorganic dielectrics or organic dielectrics. The dielectric material can be porous, non-porous, or contain regions and/or surfaces that are porous or other regions and/or surfaces that can be non-porous. Some examples of suitable dielectrics that can be used as the dielectric cap 108 include, but are not limited to, silsesquioxanes, C doped oxides (i.e., organosilicates) that include atoms of silicon (Si), carbon (C), oxygen (O), hydrogen (H), thermosetting polyarylene ethers, polyimides, polynorbornene, benzocy-clobutene, or multilayers thereof. The term "polyarylene" is used in this application to denote aryl moieties or inertly substituted aryl moieties which are linked together by bonds, fused rings, or inert linking groups such as, for example, oxygen, sulfur, sulfone, sulfoxide, carbonyl and the like. The dielectric cap 108 can be formed utilizing a deposition process such as, for example, CVD, PECVD, evaporation, chemical solution deposition and spin-on coating.

A hard mask layer 110 is shown applied atop the dielectric cap 108. The hard mask layer 110 can be formed by any method known in the art for forming a hard mask including CVD, PECVD, and sputtering. For an embodiment, the hard mask layer 110 can be formed from a bulk material such as Ti. Other bulk materials that can be used for the hard mask layer 110 include materials known in the art, such as metal nitrides, for example.

A substrate upon which the interconnect 102 is formed, which is not shown, can include a semiconducting material, an insulating material, a conductive material or any combination including multilayers thereof. When the substrate includes a semiconducting material, any semiconductor such as, for example, Si, silicon germanium (SiGe), silicon-germanium-carbon (SiGeC), silicon carbide (SiC), Ge alloys, germanium arsenide (GeAs), indium arsenide (InAs), indium phosphide (InP), and other III/V or II/VI compound semiconductors can be used. In addition to these listed types of semiconducting materials, the semiconductor substrate can be a layered semiconductor such as, for example, Si/SeGE, Si/SiC, silicon-on-insulators (SOIs) or silicon ger-manium-on-insulators (SGOIs). In one or more embodiments, the semiconducting material can include one or more semiconductor devices such as, for example, CMOS devices fabricated thereon.

When the substrate is an insulating material, the insulating material can be an organic insulator, an inorganic insulator or a combination thereof including multiplayers. When the substate is a conducting material, the substrate can include, for example, polySi, an elemental metal, alloys of elemental metals, a metal silicide, a metal nitride or combinations thereof including multiple layers. When the substrate includes a combination of an insulating material and a conductive material, the substrate can represent one of interconnect levels of a multilayered interconnect structure.

Figure 3:
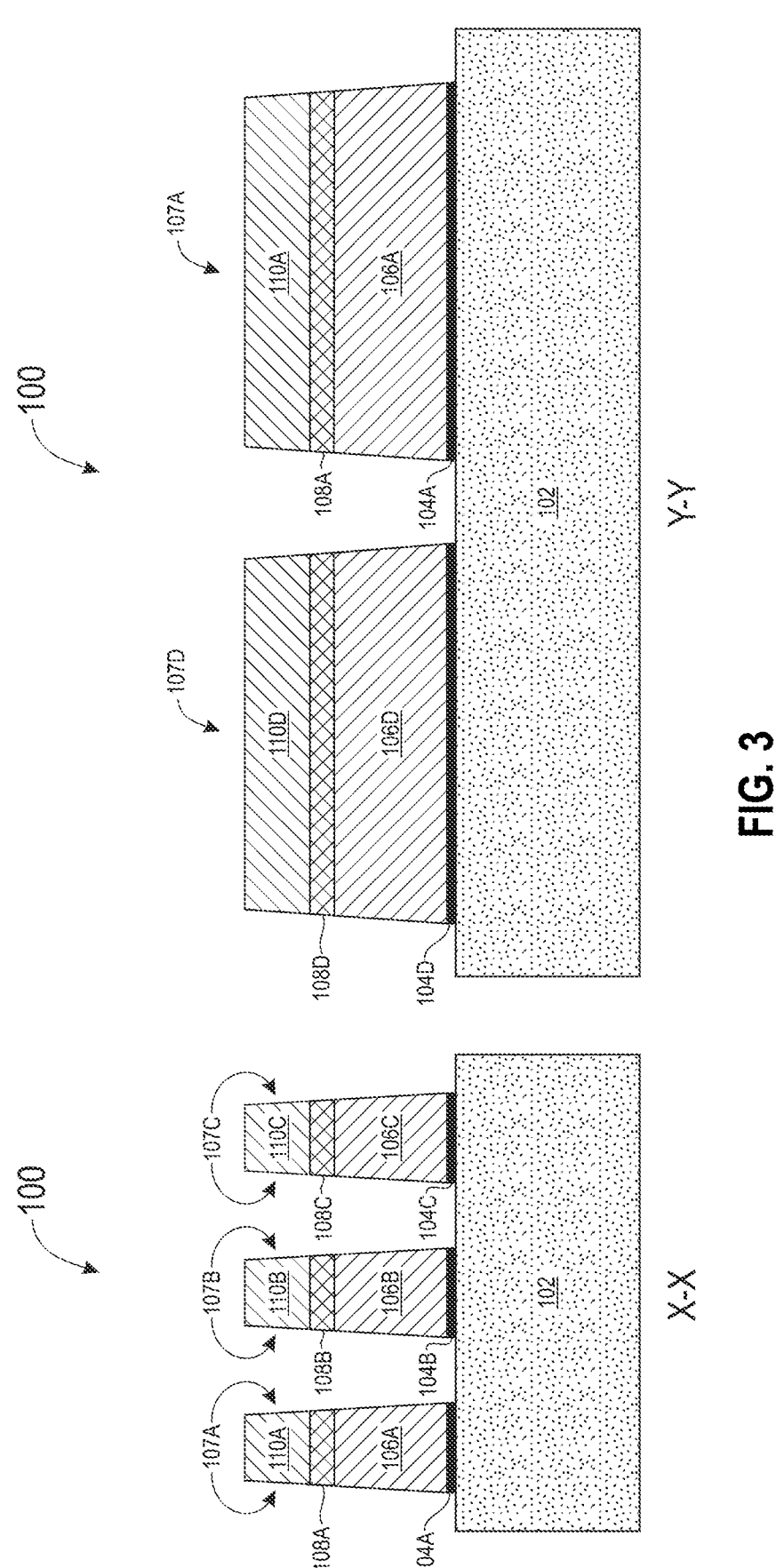
FIG. 3 illustrates two cross-sectional views during formation of the semiconductor structure of FIG. 9, taken at X-X and Y-Y (as shown in FIG. 1) after a fabrication operation, in accordance with embodiments of the disclosure.

FIG. 3 illustrates two cross-sectional views during formation of the semiconductor structure 100 of FIG. 1, taken at X-X and Y-Y (as shown in FIG. 1) after a fabrication operation subsequent to the operation of FIG. 2, in accordance with embodiments of the disclosure. The semiconductor structure 100 shown in the figure results after a metal line patterning operation. The metal line patterning operation can be performed using substrative etching, wet etching or dry etching processes, for example. After the patterning, the metal level 106 from FIG. 2 is cut or patterned into a plurality of portions of metal level, which are shown as 106A, 106B, 106C, 106D. The barrier/metal liner layer 104 also remains in the form of portions of barrier/metal liner layer 104A, 104B, 104C, 104D. The dielectric cap 108 from FIG. 2 is also shown cut or patterned into a plurality of dielectric cap portions 108A, 108B, 108C, 108D that are still located atop the plurality of portions of metal level 106A, 106B, 106C, 106D, respectively. A plurality of portions of hard mask layer 110A, 110B, 110C, 110D of the hard mask layer 110 remain located atop the dielectric cap portions 108A, 108B, 108C, 108D, respectively. The metal line patterning operation results in a slope to the sidewalls 107A, 107B, 107C, 107D of the metal levels 106A, 106B, 106C, 106D, respectively, as shown.

Figure 4:
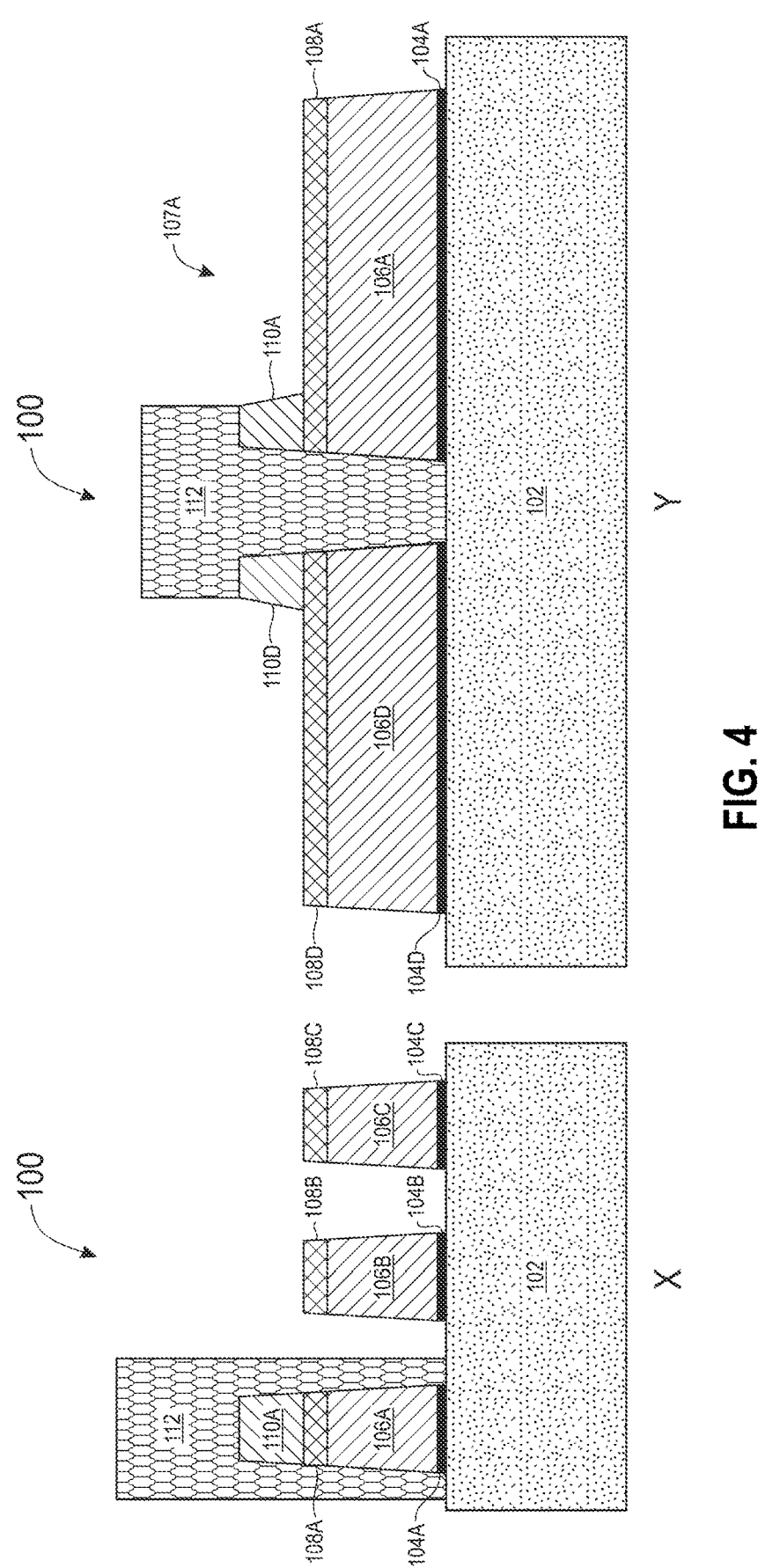
FIG. 4 illustrates two cross-sectional views during formation of the semiconductor structure of FIG. 9, taken at X-X and Y-Y (as shown in FIG. 1) after a fabrication operation, in accordance with embodiments of the disclosure.

FIG. 4 illustrates two cross-sectional views during formation of the interconnect structure of FIG. 1, taken at X-X and Y-Y (as shown in FIG. 1) after a fabrication operation subsequent to the operation of FIG. 3, in accordance with embodiments of the disclosure. The operation shown in the figure involves via patterning. The portions of hard mask layer 110A, 110B, 110C, 110D (from FIG. 3) have been selectively etched that stopped on dielectric cap portions 108A, 108D, as shown, to result in remaining portions of hard mask layer 110A, 110D. An organic planarization layer (OPL) 112 is shown deposited atop and along one side of the hard mask layer portions 110A, 110D, and between the portions of metal levels 106A, 106D. The OPL 112 can comprise, but is not necessarily limited to, an organic polymer including C, H, and N. In an embodiment, the OPL material can be free of silicon (Si). According to an embodiment, the OPL material can be free of Si and fluorine (F). As defined herein, a material is free of an atomic element when the level of the atomic element in the material is at or below a trace level detectable with analytic methods available in the art. Non-limiting examples of the OPL material include JSR HM8006, JSR HM8014, AZ UM10M2, Shin Etsu ODL 102, or other similar commercially available materials from such vendors as JSR, TOK, Sumitomo, Rohm & Haas, etc. The OPL 112 can be deposited, for example, by spin coating, or other suitable processes.

Figure 5:
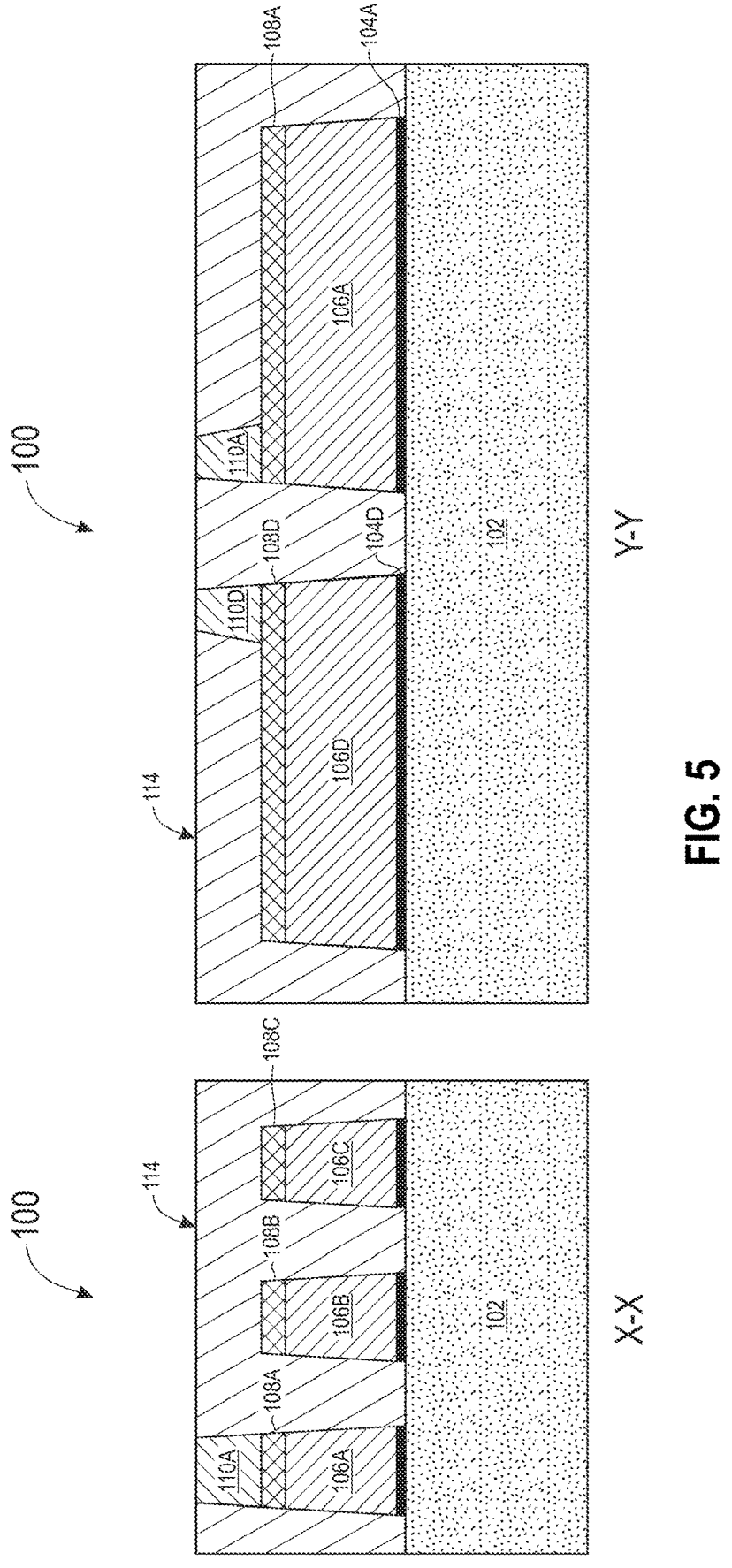
FIG. 5 illustrates two cross-sectional views during formation of the semiconductor structure of FIG. 9, taken at X-X and Y-Y (as shown in FIG. 1) after a fabrication operation, in accordance with embodiments of the disclosure.

FIG. 5 illustrates two cross-sectional views during formation of the interconnect structure of FIG. 1, taken at X-X and Y-Y (as shown in FIG. 1) after a fabrication operation subsequent to the operation of FIG. 4, in accordance with embodiments of the disclosure. The figure shows the semiconductor structure 100 after OPL ash, which is a process of removing an OPL mask using a reactive plasma source. As shown, a procedure to apply a fill of ILD 114 was performed. For the ILD 114, dielectric material such as, for example, $SiO_2$, SiN, SiOC, SiOCN, SiBCN, SiC, or a combination of any of those materials, can be deposited using deposition techniques such as, for example, CVD, PECVD, radio-frequency chemical vapor deposition (RFCVD), PVD, and/or ALD, followed by a planarization process, such as, chemical mechanical planarization (CMP). The CMP process removes excess portions of the ILD 114 deposited on top of the hard mask layer portions 110A, 110D, and polishes the semiconductor structure 100.

Figure 6:
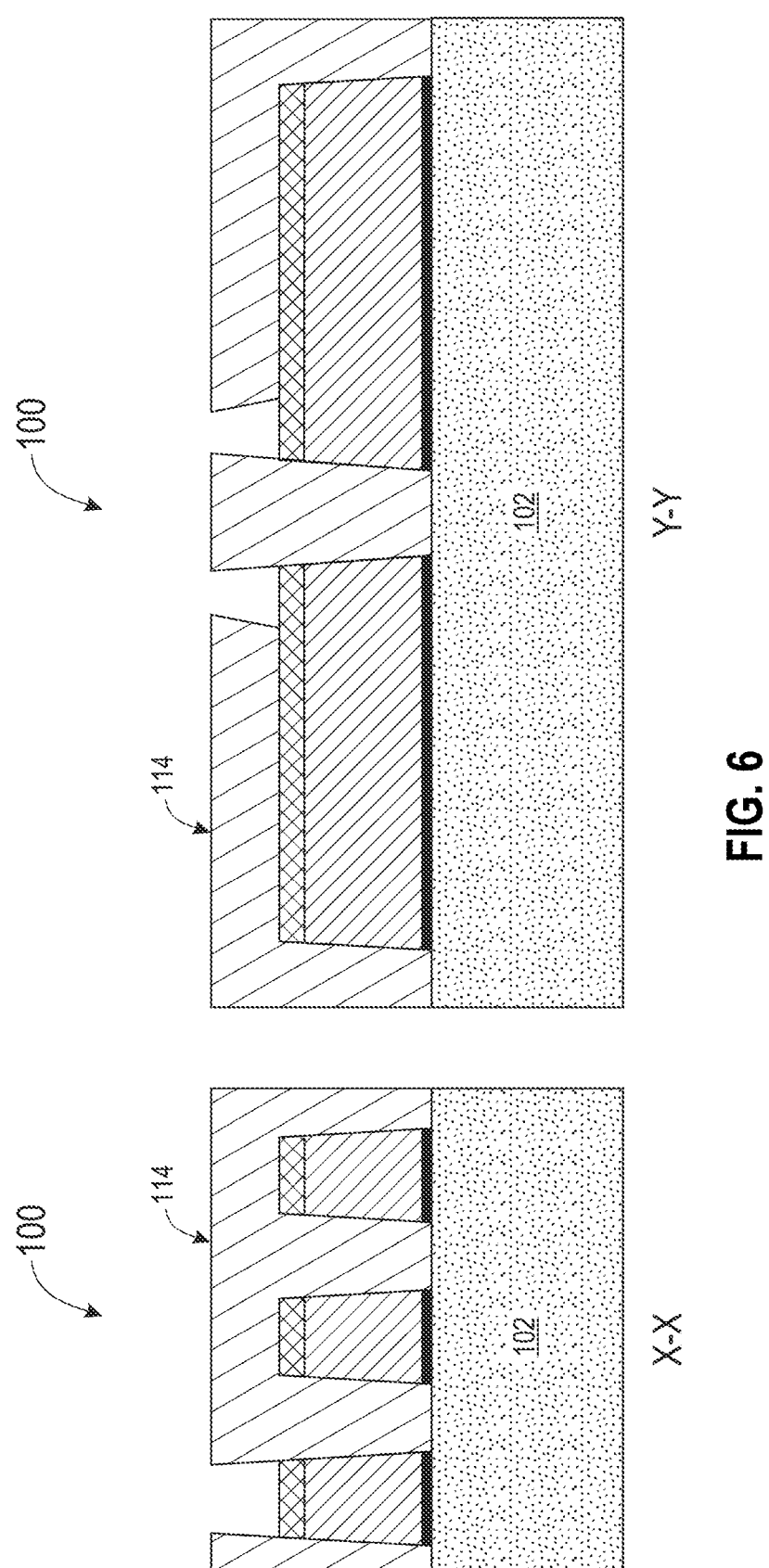
FIG. 6 illustrates two cross-sectional views during formation of the semiconductor structure of FIG. 9, taken at X-X and Y-Y (as shown in FIG. 1) after a fabrication operation, in accordance with embodiments of the disclosure.

FIG. 6 illustrates two cross-sectional views during formation of the interconnect structure of FIG. 1, taken at X-X and Y-Y (as shown in FIG. 1) after a fabrication operation subsequent to the operation of FIG. 5, in accordance with embodiments of the disclosure. The figure shows the semiconductor structure 100 after selective removal of the hard mask layer portions 110A, 110D. Selective removal can be performed using a wet or a dry etching process, for example.

FIG. 7 illustrates two cross-sectional views during formation of the interconnect structure of FIG. 1, taken at X-X and Y-Y (as shown in FIG. 1) after a fabrication operation subsequent to the operation of FIG. 6, in accordance with embodiments of the disclosure. The figure shows the semiconductor structure 100 after selective etching portions of the dielectric caps 108A, 108D, as shown. Selective etching can be performed using a wet or a dry isotropic etching process, for example. The selective etching results in openings 116A and 116D in which hard mask layer portions 110A, 110D used to be located. In addition, etching of at least a portion the dielectric caps 108A, 108D extends to portions of the dielectric caps 108A, 108D that are located laterally from the openings 116A, 116D as shown.

FIG. 8 illustrates two cross-sectional views during formation of the interconnect structure of FIG. 1, taken at X-X and Y-Y (as shown in FIG. 1) after a fabrication operation subsequent to the operation of FIG. 7, in accordance with embodiments of the disclosure. The figure shows the semiconductor structure 100 after selective metal growth has taken place to form vias 118A, 118D. The metal can be any suitable metal, such as Co or Ru, for example. If Cu, which is commonly used, were used for the vias 118A, 118D, a liner/barrier layer would be required that would take up space, which is not preferred.

FIG. 9 illustrates two cross-sectional views during formation of the interconnect structure of FIG. 1, taken at X-X and Y-Y (as shown in FIG. 1) after a fabrication operation subsequent to the operation of FIG. 8, in accordance with embodiments of the disclosure. The figure shows the semiconductor structure 100 after a next metal level or line (Mx+1) 120A, 120D is added. The figure also shows a plurality of other metal lines 122 in the Y-Y cross-sectional view.

As shown, the semiconductor structure 100 includes the metal levels (Mx) 106A, 106D located in the ILD 114 and above the interconnect 102. The metal levels 106A, 106D can be confined on both sides by the ILD 114. The vias 118A, 118D are each located directly on top of at least a first portion of one of the metal levels 106A, 106D, wherein each of the vias 118A, 118D is tapered such that a smaller CD is located at a top 119A, 119D of each of the vias 118A, 118D and a larger CD is located at the bottom of each of the vias, and the bottom 117A, 117D of the vias 118A, 118D are located adjacent (with "adjacent" meaning, e.g., being in direct contact with) one of the metal levels 106A, 106D and each includes an extension portion 121A, 121D that extends along at least a portion of the metal level 106A, 106D away from a remainder of the width of the via 118A, 118D. The extension portion 121A, 121D can extend adjacent the metal level 106A, 106D and can have a dimension (i.e., length) of the extension that can range from a small percentage (i.e., 5-10%) of the remainder of width of the via 118A or 118D adjacent the metal level 106A or 106D to a large percentage (i.e., 95-100%) of the remainder of the width of the via 118A or 118D. The extension portions 121A, 121D can also be applied to higher metal levels further in the BEOL. A dielectric cap 108A, 108D is located on top of a second portion of each of the metal levels 106A, 106D on which each of the vias 118A, 118D is not located directly thereon. The extension portion 121A, 121D is shown terminated by the dielectric cap 108A, 108D. The dielectric cap 108A, 108D, as shown, extends along the metal level 106A, 106D past the extension portion 121A, 121D of the via 118A,

118D, which. The next metal levels (Mx+1) 120A, 120D are each located directly on the top of one of the vias 118A, 118D.

There are benefits of the resultant semiconductor structure 100, as shown in FIG. 9. For example, no metal liner is included between the vias 118A, 118D and the portions of metal level 106A, 106D, respectively. As a result of no metal liner, there is low interface resistance. The top of the vias 118A, 118D also beneficially have a smaller CD than the bottom of the vias 118A, 118D, which results in a lower chance of via shorting to the neighboring or next metal line Mx+1 120A, 120D, respectively. The larger or higher CD at the bottom of the vias 118A, 118D provides an even lower resistance between the vias 118A, 118D and the portion of metal level 106A, 106D, respectively. Further, the larger bottom CD of the vias 118A, 118D is confined within the portion of metal level 106A, 106D, which results in no concern of via to via or via to metal line shorting due to the larger bottom CD of the vias 118A, 118D.

FIG. 10 is a flow diagram of a process 200 for forming a semiconductor structure 100 as disclosed herein, in accordance with embodiments of the disclosure. The figure includes an operation 210 of forming an initial stack 101 including an interconnect 102 with a metal liner 104 deposited on the interconnect 102, a metal level 106 deposited on the metal liner 104, a dielectric cap 108 deposited on the metal level 106, and a hard mask layer 110 deposited on the dielectric cap 108. Another operation 220 is subtractively cutting and patterning the initial stack 101 to form a plurality of metal lines 106A, 106B, 106C, 106D with portions of the dielectric cap 108A, 108B, 108C, 108D and portions of the hard mask layer 110A, 110B, 110C, 110D located thereon. A further operation 230 includes patterning a plurality of openings 116A, 116B, 116C, 116D on top of the portions of the dielectric cap 108A, 108B, 108C, 108D. Yet another operation 240 is etching portions of the dielectric cap 108A, 108B, 108C, 108D that are exposed within the plurality of openings 116A, 116B, 116C, 116D and a portion of the dielectric cap 108A, 108B, 108C. 108D extending laterally away from the plurality of openings 116A, 116B, 116C, 116D. Another operation 250 is filling the plurality of openings 116A, 116B, 116C, 116D and the etched portions of the dielectric cap 108A, 108B, 108C, 108D to form a plurality of vias 118A, 118B, 118C, 118D. An additional operation 260 is forming a plurality of next metal lines 120A, 120B, 120C, 120D with one of the plurality of next metal lines 120A, 120B, 120C, 120D being located on top of each of the plurality of vias 118A, 118B, 118C, 118D. The etching operation 240 can be isotropic etching. The plurality of vias 118A, 118B, 118C, 118D can be formed by selective metal growth. The plurality of vias 118A, 118B, 118C, 118D can be located directly on one of the plurality of metal lines. The plurality of vias can each include an extension portion that extends along each of the plurality of metal lines 106A, 106B, 106C, 106D, and each of the extension portions 121A, 121B, 121C, 121D can be terminated by the dielectric cap 108A, 108B, 108C, 108D.

For purposes of this description, certain aspects, advantages, and novel features of the embodiments of this disclosure are described herein. The disclosed processes, and systems should not be construed as being limiting in any way. Instead, the present disclosure is directed toward all novel and nonobvious features and aspects of the various disclosed embodiments, alone and in various combinations and sub-combinations with one another. The processes, and systems are not limited to any specific aspect or feature or combination thereof, nor do the disclosed embodiments require that any one or more specific advantages be present, or problems be solved.

Although the operations of some of the disclosed embodiments are described in a particular, sequential order for convenient presentation, it should be understood that this manner of description encompasses rearrangement, unless a particular ordering is required by specific language set forth below. For example, operations described sequentially can in some cases be rearranged or performed concurrently. Moreover, for the sake of simplicity, the attached figures may not show the various ways in which the disclosed processes can be used in conjunction with other processes. Additionally, the description sometimes uses terms like "provide" or "achieve" to describe the disclosed processes. These terms are high-level abstractions of the actual operations that are performed. The actual operations that correspond to these terms can vary depending on the particular implementation and are readily discernible by one of ordinary skill in the art.

As used in this application and in the claims, the singular forms "a," "an," and "the" include the plural forms unless the context clearly dictates otherwise. Additionally, the term "includes" means "comprises."

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to explain the principles of the embodiments, the practical application or technical improvement over technologies found in the marketplace, or to enable others of ordinary skill in the art to understand the embodiments disclosed herein.

The invention claimed is:

1. A semiconductor structure, comprising:
    a metal level;
    a via located directly on a top surface of a first portion of the metal level, wherein the via is tapered such that a smaller critical dimension is located at a top portion of the via and a larger critical dimension is located at a bottom portion of the via, and the bottom portion of the via is located directly on the top surface of the first portion of the metal level, and wherein the via includes an extension portion that extends parallel to the metal level and is located directly on the top surface of the first portion of the metal level;
    a dielectric cap located directly on a top surface of a second portion of the metal level on which the via is not located directly thereon; and
    a next metal level that is located directly on a top surface of the top portion of the via.

2. The semiconductor structure of claim 1, wherein the extension portion is terminated by the dielectric cap.

3. The semiconductor structure of claim 1, wherein the metal level includes sidewalls that are confined by an interlayer dielectric material.

4. The semiconductor structure of claim 1, wherein the metal level comprises ruthenium, tungsten, aluminum, cobalt, copper, manganese, titanium, or alloys thereof.

5. The semiconductor structure of claim 1, further comprising:
    a second metal level;
    a second via located directly on top of a first portion of the second metal level, wherein the second via is tapered such that a second smaller critical dimension is located at a top portion of the second via and a second larger critical dimension is located at a bottom portion of the second via, and the bottom portion of the second via is located adjacent the second metal level;
    a second dielectric cap located on top of a second portion of the second metal level on which the second via is not located directly thereon; and
    a second next metal level that is located directly on the top portion of the second via.

6. The semiconductor structure of claim 5, wherein the second via includes a second extension portion that extends along the second metal level.

7. The semiconductor structure of claim 6, wherein the second extension portion is terminated by the second dielectric cap.

8. The semiconductor structure of claim 5, wherein the second metal level includes sidewalls that are confined by an interlayer dielectric material.

9. The semiconductor structure of claim 5, wherein the second metal level comprises ruthenium, tungsten, aluminum, cobalt, copper, manganese, titanium, or alloys thereof.

10. A semiconductor structure, comprising:
    a first metal line;
    a via located directly atop a top surface of the first metal line, and including an extended bottom portion that is located directly atop a first portion of the top surface of the first metal line and extends parallel to the first metal line; and
    a second metal line located directly atop the via.

11. The semiconductor structure of claim 10, wherein a dielectric cap is located directly atop a second portion of the first metal line and directly contacts a side of the extended bottom portion of the via.

12. The semiconductor structure of claim 10, wherein the first metal line includes sidewalls that are confined by an interlayer dielectric material.

13. The semiconductor structure of claim 1, wherein the via extends perpendicular to the metal level.

14. The semiconductor structure of claim 10, wherein the via extends perpendicular to the first metal line.

* * * * *